US008345432B2

(12) United States Patent
Yuan

(10) Patent No.: US 8,345,432 B2
(45) Date of Patent: Jan. 1, 2013

(54) ELECTRONIC DEVICE WITH SLIM BUTTON

(75) Inventor: Hui Yuan, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 337 days.

(21) Appl. No.: 12/820,076

(22) Filed: Jun. 21, 2010

(65) Prior Publication Data

US 2011/0157848 A1 Jun. 30, 2011

(30) Foreign Application Priority Data

Dec. 31, 2009 (CN) .......................... 2009 1 0312863

(51) Int. Cl.
*H05K 5/00* (2006.01)

(52) U.S. Cl. ....................................................... 361/752

(58) Field of Classification Search .................. 361/752, 361/212, 679.02, 753; 174/382; 200/406
See application file for complete search history.

(56) References Cited

U.S. PATENT DOCUMENTS

2009/0103250 A1* 4/2009 Takashima et al. ...... 361/679.02

* cited by examiner

*Primary Examiner* — Jeremy Norris
*Assistant Examiner* — Tremesha S Willis
(74) *Attorney, Agent, or Firm* — Altis Law Group, Inc.

(57) ABSTRACT

An electronic device includes a base, a cover attached to the base and defining at least one receiving hole and at least one button movably received in one of the at least one receiving hole. The electronic device further includes a printed circuit board fixed to the base, at least one switch and a resilient plate. The at least one switch is arranged on the printed circuit board, each corresponding to one of the at least one receiving hole. The resilient plate cantilevered on the printed circuit board, and includes at least one suspended end abutting against the inner surface of the cover and being under the receiving hole. When being pressed, the at least one button moves inward to urge the suspended end to move downward to actuate the switch.

6 Claims, 3 Drawing Sheets

ELECTRONIC DEVICE WITH SLIM BUTTON

BACKGROUND

1. Technical Field

The present disclosure relates to electronic devices with buttons, more particularly, to an electronic device with a slim button.

2. Description of the Related Art

Portable electronic devices such as cell phones usually include a plurality of buttons. Each key/button corresponds to a switch arranged on a circuit board. A flexible metal/plastic dome may be arranged on each switch. When pressed, the dome moves downward to actuate a corresponding switch and moves back when released. For the conventional structure of such button, spaces are required to accommodate the circuit board, the dome, and the switch, which may not satisfy the requirement for a slim design of the portable electronic device.

Therefore, what is needed is an electronic device with a slim button that requires less space than the conventional buttons.

BRIEF DESCRIPTION OF THE DRAWINGS

The components in the drawings are not necessarily drawn to scale, the emphasis instead being placed upon clearly illustrating the principles of an electronic device with a slim button. Moreover, in the drawings, like reference numerals designate corresponding parts throughout the several views.

DETAILED DESCRIPTION

Figure 1:
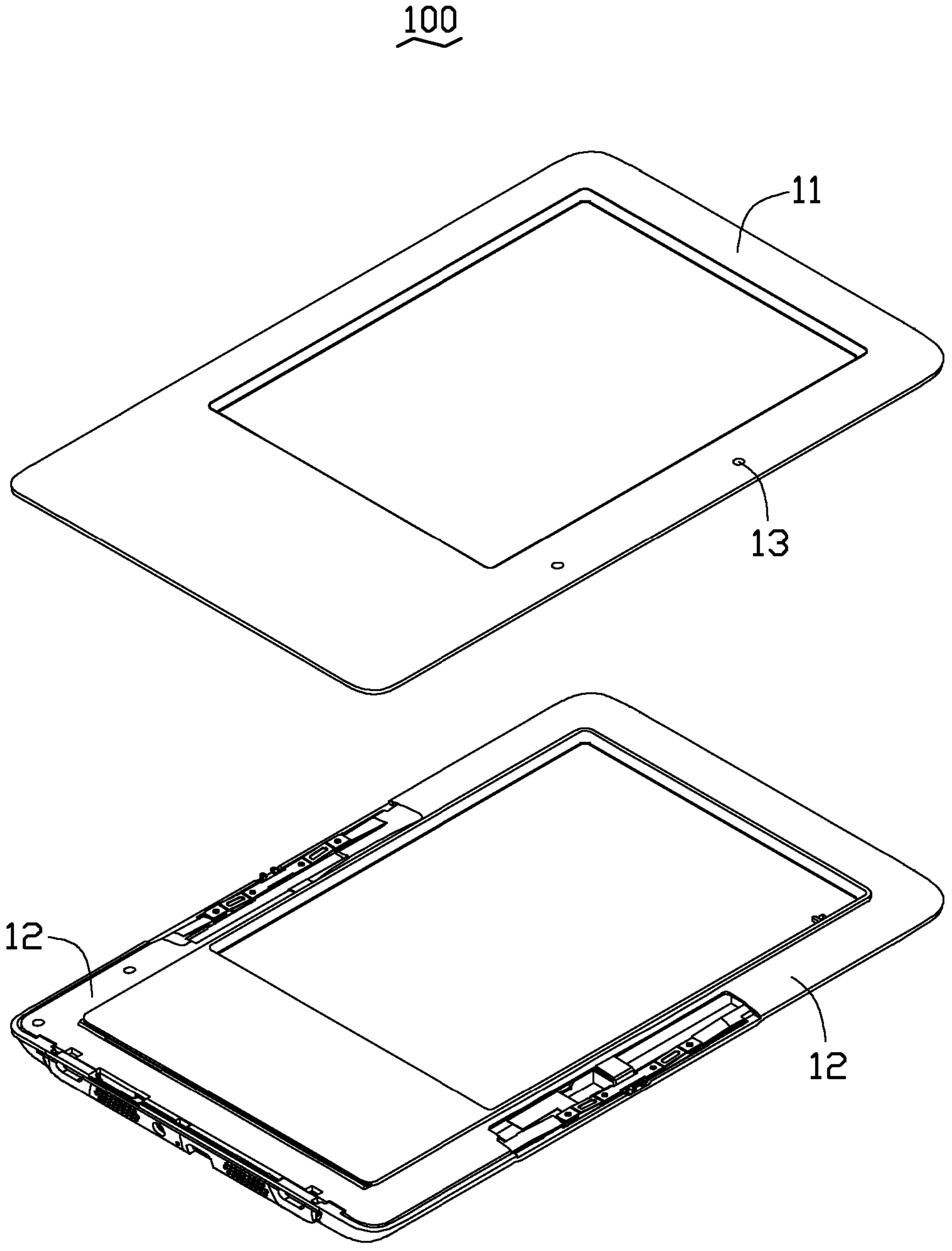
FIG. 1 is an isometric view of an electronic device in accordance with an exemplary embodiment.
Figure 2:
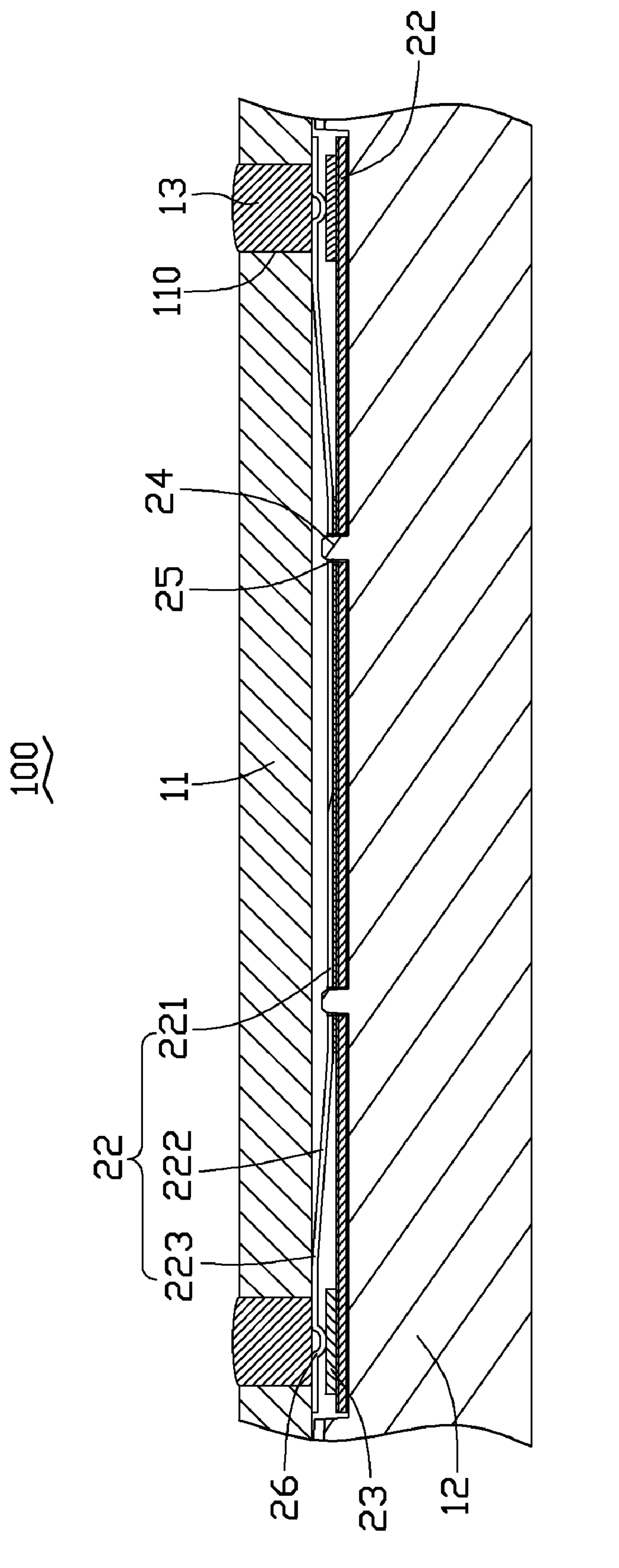
FIG. 2 is a cross-sectional view of the electronic device of FIG. 1.

Referring to FIGS. 1-2, an electronic device 100 includes a cover 11 and a base 12. The cover 11 is attached to the base 12 and defines at least one receiving hole 110. One button 13 is received in each of the at least one receiving hole 110. In the exemplary embodiment, the cover 11 defines two receiving holes 110 to receive the two buttons 13, respectively. Each of the receiving holes 110 is tightly filled with elastomeric material to form the button 13, thus it is difficult to disengage the button 13 from the cover 11.

Figure 3:
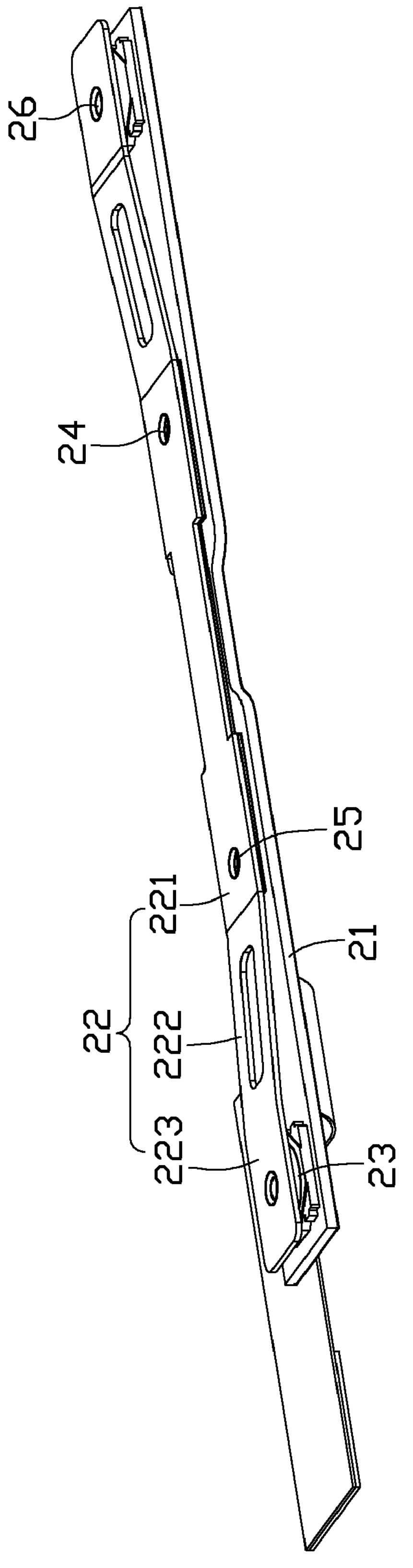
FIG. 3 is an enlarged, perspective view of the pressing part of the electronic device of FIG. 1.

Referring also to FIG. 3, the electronic device 100 further includes a printed circuit board (PCB) 21 fixed to the base 12, a resilient plate 22, and at least one switch 23 arranged on the PCB 21. Each of the at least one switch 23 corresponds to one of the receiving holes 110. The resilient plate 22 is cantilevered on the PCB 21. In the exemplary embodiment, the resilient plate 22 is made of metal material.

The resilient plate 22 includes at least one suspended end 223 at its free end. The suspended end 223 abuts against the inner surface of the cover 11 under the receiving hole 110. The resilient plate 22 further includes a fixing portion 221, and a pair of connecting portions 222. The fixing portion 221 is fixed on the PCB 21 by any conventional connection technique, such as screwing or soldering. The connecting portions 222 obliquely extend upward from each end of the fixing portion 221. The surface of the suspended end 223 is substantially parallel to the fixing portion 221. A protrusion 26 is formed on the suspended end 223. The protrusion 26 faces the PCB 21 and is arranged above the switch 23.

The PCB 21 further defines two positioning posts 24. Two alignment holes 25 are defined in the fixing portion 221. Each positioning post 24 is inserted into one of the alignment holes 25 to fix the resilient plate 22 to the PCB 21.

When the button 13 is pressed, the pressing portion 223 move toward the switch 23 until the protrusion 26 contacts and actuates the switch 23. Once the button 13 is released, the resilient plate 22 rebounds to urge the button 13 to move back.

It is understood that the present disclosure may be embodied in other forms without departing from the spirit thereof. Thus, the present examples and embodiments are to be considered in all respects as illustrative and not restrictive, and the disclosure is not to be limited to the details given herein.

What is claimed is:

1. An electronic device comprising:

a base;

a cover attached to the base and defining two receiving holes;

two buttons each movably received in one of the receiving holes;

a printed circuit board selectively fixed to one of the cover and the base;

two switches arranged on the printed circuit board, each corresponding to one of the receiving holes; and a resilient plate cantilevered on the printed circuit board and comprising two suspended ends abutting against an inner surface of the cover, each of the two suspended ends being under one of the buttons, wherein when one of the buttons being pressed, the button pressed moves inward to urge the corresponding suspending ends to move downward to actuate the corresponding switch.

2. The electronic device as recited in claim 1, wherein each of the receiving holes is tightly filled with elastomeric material to form the button.

3. The electronic device as recited in claim 1, wherein a protrusion is formed on each of the suspended ends, and the protrusion faces the printed circuit board and is arranged above one of the switches.

4. The electronic device as recited in claim 1, wherein the resilient plate further comprises a fixing portion, and two connecting portions; the fixing portion is fixed on the printed circuit board, and the connecting portions obliquely extend upward from the fixing portion.

5. The electronic device as recited in claim 4, wherein the fixing portion is fixed on the printed circuit board by screwing or soldering.

6. The electronic device as recited in claim 4, wherein the printed circuit board further defines two positioning posts, two alignment holes are defined in the fixing portion; each positioning post is inserted into one of the alignment holes to fix the resilient plate to the printed circuit board.

* * * * *